United States Patent
Kim et al.

(10) Patent No.: US 10,431,386 B2
(45) Date of Patent: Oct. 1, 2019

(54) MULTILAYER ELECTRONIC COMPONENT INCLUDING A COMPOSITE BODY AND METHOD OF MANUFACTURING THE SAME

(71) Applicant: SAMSUNG ELECTRO-MECHANICS CO., LTD., Suwon-si, Gyeonggi-do (KR)

(72) Inventors: Byung Soo Kim, Suwon-si (KR); Moon Soo Park, Suwon-si (KR); Jong Ho Lee, Suwon-si (KR); Hyuk Jin Hong, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 48 days.

(21) Appl. No.: 15/292,813

(22) Filed: Oct. 13, 2016

(65) Prior Publication Data
US 2017/0207025 A1   Jul. 20, 2017

(30) Foreign Application Priority Data
Jan. 14, 2016  (KR) ........................ 10-2016-0004927

(51) Int. Cl.
| | |
|---|---|
| *H01G 4/30* | (2006.01) |
| *H01G 4/12* | (2006.01) |
| *H01G 4/012* | (2006.01) |
| *H01G 4/248* | (2006.01) |
| *H01G 4/258* | (2006.01) |

(52) U.S. Cl.
CPC ............ *H01G 4/308* (2013.01); *H01G 4/012* (2013.01); *H01G 4/1227* (2013.01); *H01G 4/248* (2013.01); *H01G 4/258* (2013.01)

(58) Field of Classification Search
CPC ...... H01G 4/012; H01G 4/1227; H01G 4/248; H01G 4/308; H01G 4/258
See application file for complete search history.

(56) References Cited

U.S. PATENT DOCUMENTS

| 6,885,538 B1 | 4/2005 | Ishii et al. |
| 6,903,919 B2* | 6/2005 | Kayatani ................ H01G 2/103 |
| | | 29/25.41 |
| 6,903,920 B1* | 6/2005 | Prymak .................. H01G 2/065 |
| | | 361/306.1 |

(Continued)

FOREIGN PATENT DOCUMENTS

| JP | 06244003 A | * | 9/1994 |
| JP | 08162357 A | * | 6/1996 |

(Continued)

*Primary Examiner* — David M Sinclair
(74) *Attorney, Agent, or Firm* — Morgan, Lewis & Bockius LLP

(57) ABSTRACT

A multilayer electronic component includes a main body including an active region in which a plurality of internal electrodes are stacked with respective dielectric layers interposed therebetween, and upper and lower cover regions disposed above and below the active region, respectively, external electrodes disposed on external surfaces of the main body and electrically connected to the plurality of internal electrodes, and a composite body disposed below the lower cover region of the main body and lower portions of the external electrodes.

16 Claims, 5 Drawing Sheets

10

(56) References Cited

U.S. PATENT DOCUMENTS

| | | | | |
|---|---|---|---|---|
| 2002/0099150 A1* | 7/2002 | Kumazawa | .......... | C08G 59/226 |
| | | | | 525/438 |
| 2003/0178227 A1* | 9/2003 | Matsunaga | ............ | H05K 3/027 |
| | | | | 174/257 |
| 2006/0158827 A1 | 7/2006 | Lee et al. | | |
| 2007/0253140 A1* | 11/2007 | Randall | ................ | H01G 4/0085 |
| | | | | 361/300 |
| 2010/0091425 A1* | 4/2010 | Takeoka | ................. | H01G 2/103 |
| | | | | 361/301.4 |
| 2013/0056252 A1 | 3/2013 | Fujii et al. | | |
| 2014/0085767 A1* | 3/2014 | Kang | ....................... | H01G 4/12 |
| | | | | 361/301.4 |
| 2014/0187674 A1* | 7/2014 | Lee | ........................ | C09J 185/02 |
| | | | | 523/435 |
| 2014/0362494 A1* | 12/2014 | Cheng | .................. | H05K 1/0366 |
| | | | | 361/324 |
| 2014/0376151 A1* | 12/2014 | Kim | ......................... | H01G 4/30 |
| | | | | 361/301.4 |

FOREIGN PATENT DOCUMENTS

| | | | | | | |
|---|---|---|---|---|---|---|
| JP | | 2000182888 | A | * | 6/2000 | |
| JP | | 2006-203165 | A | | 8/2006 | |
| JP | | 2012222124 | A | * | 11/2012 | |
| JP | | 2014027085 | A | * | 2/2014 | ............... H01G 4/30 |
| KR | | 10-0575990 | B1 | | 5/2006 | |
| KR | 10-2014-0128931 | A | | 11/2014 | | |

\* cited by examiner

MULTILAYER ELECTRONIC COMPONENT INCLUDING A COMPOSITE BODY AND METHOD OF MANUFACTURING THE SAME

CROSS-REFERENCE TO RELATED APPLICATION

This application claims the benefit of priority to Korean Patent Application No. 10-2016-0004927, filed on Jan. 14, 2016 in the Korean Intellectual Property Office, the entirety of which is incorporated herein by reference.

TECHNICAL FIELD

The present disclosure relates to a multilayer electronic component where acoustic noise generated between internal electrodes at the time of applying a voltage thereto is decreased, and a method of manufacturing the same.

BACKGROUND

In a multilayer capacitor, which is a type of multilayer electronic component, internal electrodes are disposed between a plurality of dielectric layers.

When direct current (DC) voltage or alternating current (AC) voltage is applied to the multilayer capacitor in which the internal electrodes overlap each other with respective dielectric layers interposed therebetween, a piezoelectric phenomenon may occur between the internal electrodes and vibrations may be generated.

As the permittivity of the dielectric layer is increased, and the electronic component is increased in size, to obtain the same amount of capacitance, these vibrations tend to increase. Such vibrations may be transferred from the external electrodes of the multilayer capacitor to a board on which the multilayer capacitor is mounted. In such a case, the board vibrates, generating resonance.

That is, when resonance generated by the vibration of the board corresponds to an audio frequency within a range of 20 to 2,000 Hz, the vibration sound may cause user discomfort. The vibration sound as described above is commonly known as acoustic noise.

In order to decrease the incidence of such acoustic noise, a method of controlling a height of a solder fillet, a height of a solder contacting one surface of a multilayer electronic component when the multilayer capacitor is mounted on a board by the solder by allowing thicknesses of upper and lower covers of the multilayer capacitor to be different from each other has been suggested. However, there is a limitation in decreasing acoustic noise using only the methods as described above.

SUMMARY

An aspect of the present disclosure provides a multilayer electronic component where acoustic noise is significantly decreased when the multilayer electronic component is mounted on a circuit board, and a method of manufacturing the same.

An aspect of the present disclosure also provides a multilayer electronic component where solder cracks are less likely to be generated in the multilayer electronic component when the multilayer electronic component is mounted on a circuit board, and a method of manufacturing the same.

According to an aspect of the present disclosure, a multilayer electronic component includes: a main body including an active region in which a plurality of internal electrodes are stacked with respective dielectric layers interposed therebetween, and upper and lower cover regions disposed above and below the active region, respectively; external electrodes disposed on external surfaces of the main body and electrically connected to the plurality of internal electrodes; and a composite body disposed below the lower cover region of the main body and lower portions of the external electrodes.

According to another aspect of the present disclosure, a method of manufacturing a multilayer electronic component includes steps of: preparing a preliminary body including a main body having a stacked structure in which a plurality of internal electrodes are stacked and containing a dielectric material, and external electrodes formed on external surfaces of the main body and electrically connected to the plurality of internal electrodes; disposing the preliminary body on a composite body containing a dielectric material and a resin; pressing the preliminary body and the composite body from an upper portion of the preliminary body to a lower portion of the composite body so that a lower portion of the preliminary body is bonded to an upper portion of the composite body; cutting the bonded preliminary body and composite body into individual composite components; and curing the individual composite components formed of the preliminary body and the composite body after the cutting.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
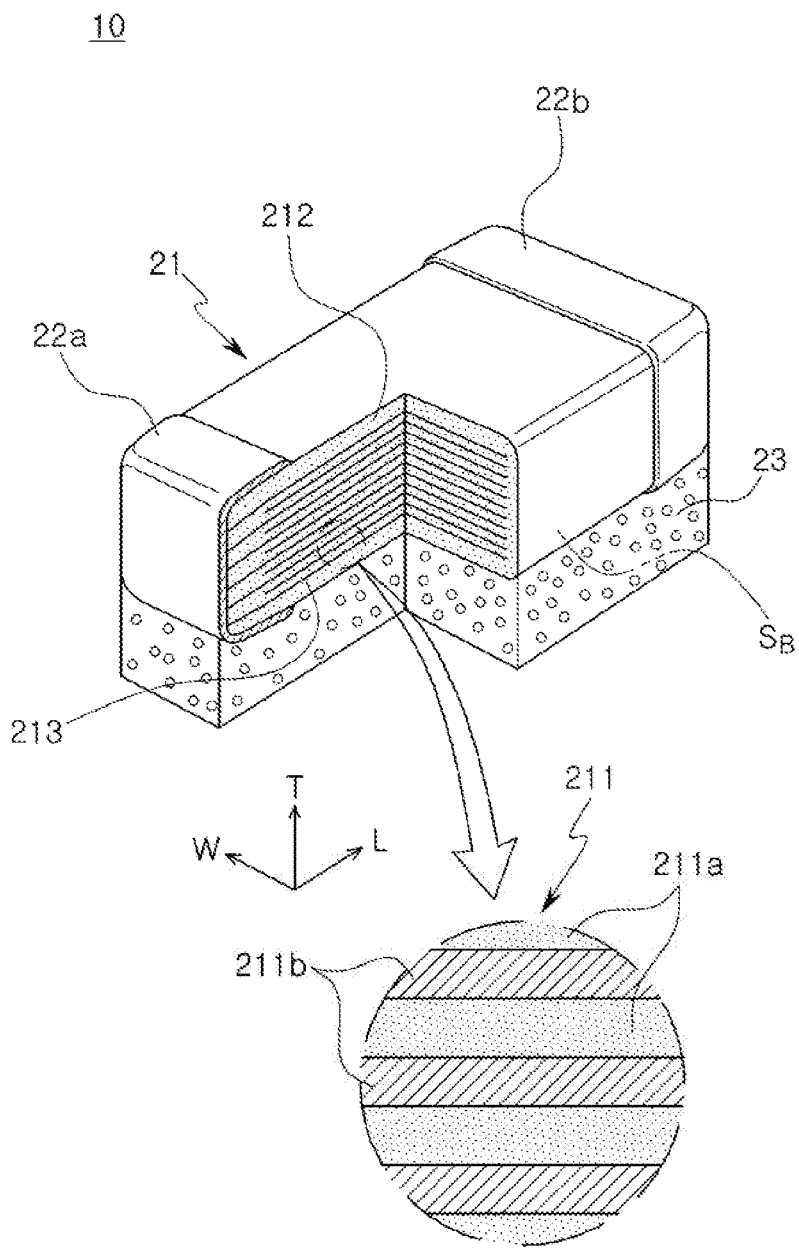
FIG. 1 is a schematic partially cut-away perspective view of a multilayer electronic component according to an exemplary embodiment in the present disclosure.

Exemplary embodiments of the present disclosure will now be described in detail with reference to the accompanying drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on, " "directly connected to," or "directly coupled to" another element, there may be no other elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship relative to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an, " and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Multilayer Electronic Component

Hereinafter, a multilayer electronic component according to an exemplary embodiment in the present disclosure will be described. Particularly, a multilayer capacitor will be described by way of example, but the present disclosure is not necessarily limited thereto.

According to the present exemplary embodiment, a T-direction refers to a stacking direction of dielectric layers of the multilayer electronic component, an L-direction refers to a length direction of a body, and a W-direction refers to a width direction of the body.

According to the present exemplary embodiment, a lower portion of a main body may be a portion facing a circuit board when the multilayer electronic component is mounted on the circuit board, and an upper portion of the main body may be a portion extended in the T-direction in which the dielectric layers are stacked from the lower portion.

Figure 2:
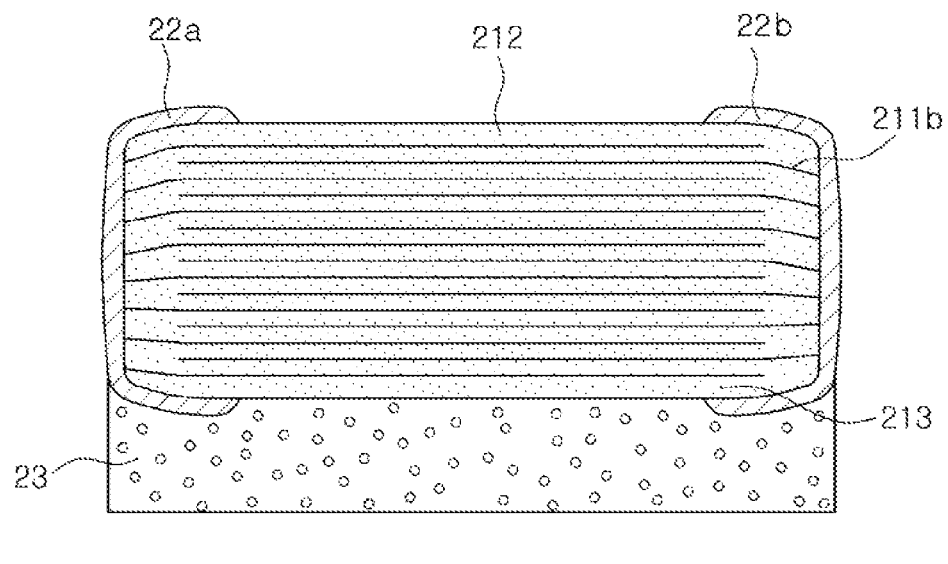
FIG. 2 is a cross-sectional view of the multilayer electronic component taken along line I-I' of FIG. 1.
Figure 2:
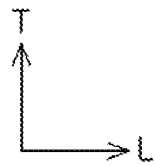
Figure 3:
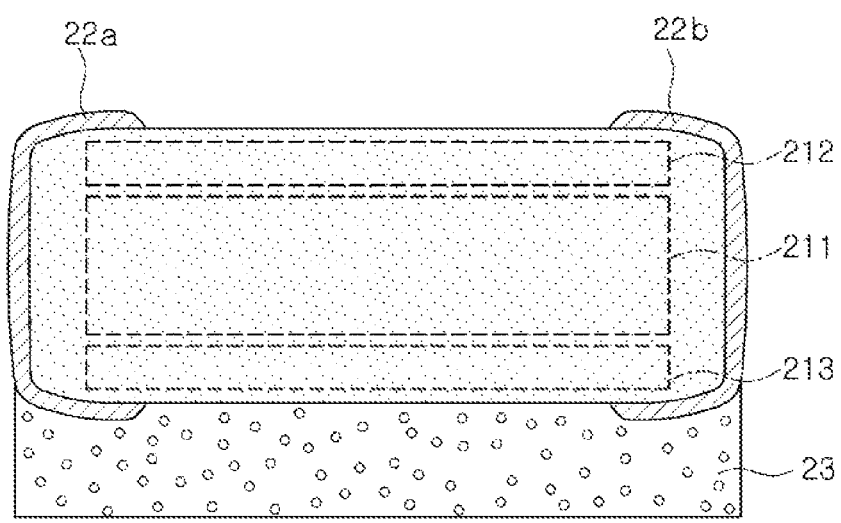
FIG. 3 is a schematic cross-sectional view illustrating the multilayer electronic component of FIG. 2.
Figure 3:
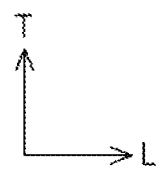

FIG. 1 is a schematic partially cut-away perspective view of a multilayer electronic component according to the present exemplary embodiment, FIG. 2 is a cross-sectional view of the multilayer electronic component taken along line I-I' of FIG. 1, and FIG. 3 is a schematic cross-sectional view illustrating the multilayer electronic component of FIG. 2.

Referring to FIGS. 1 through 3, the multilayer electronic component 10 according to the exemplary embodiment in the present disclosure may include a main body 21, external electrodes 22, and a composite body 23.

The main body 21 may include an active region 211 in which a plurality of internal electrodes 211b are stacked with respective dielectric layers 211a interposed therebetween and upper and lower cover regions 212 and 213 disposed above and below the active region, respectively.

The plurality of dielectric layers 211a in the main body 21 may be in a sintered state, and adjacent dielectric layers 211a may be integrated with each other such that boundaries therebetween may not be readily apparent without the use of a scanning electron microscope (SEM).

The plurality of dielectric layers 211a may contain a ceramic powder having high permittivity, for example, a barium titanate ($BaTiO_3$)-based powder, a strontium titanate ($SrTiO_3$)-based powder, or the like. However, a material of the dielectric layer 211a is not limited thereto. A thickness of the dielectric layer 211a may be optionally changed according to the capacitance design of the multilayer electronic component 10. Preferably, a thickness of a single dielectric layer may be 0.01 to 1.00 μm after sintering, but the thickness of the dielectric layer 211a is not limited thereto.

Furthermore, a plurality of first and second internal electrodes 211b may be repeatedly stacked with respective dielectric layers 211a interposed therebetween in the active region 211 of the body 21. The first and second internal electrodes may be formed by printing a conductive paste on the dielectric layers, and as a specific printing method of the conductive paste, a screen printing method, a gravure printing method, or the like, may be used, but the printing method is not limited thereto. A conductive metal contained in the conductive paste may be nickel (Ni), copper (Cu), palladium (Pd), or alloys thereof.

The upper and lower cover regions 212 and 213 may be disposed above and below the active region 211 of the main body 21, respectively. The upper and lower cover regions 212 and 213 may have the same material and configuration as those of the dielectric layers 211a except that internal electrodes are not included therein. Furthermore, the upper and lower cover regions 212 and 213 may be formed by stacking one or two or more dielectric layers above and below the active region, respectively, and generally serve to prevent the first and second internal electrodes 211b from being damaged by physical or chemical stress.

Thicknesses of the upper and lower cover regions 212 and 213 are not particularly limited.

As an example, the upper cover region 212 may be formed to be thicker than the lower cover region 213. According to the related art, a lower cover region is formed to be thicker than an upper cover region in order to decrease acoustic noise, solder cracks, or the like, but according to the exemplary embodiment in the present disclosure, since the composite body is added on a lower surface of the lower cover region of the main body, an effect of decreasing acoustic noise and solder cracks, and an effect of protecting the electronic component from a board may be implemented by the composite body without forming the lower cover region to be thicker.

Meanwhile, first and second external electrodes 22a and 22b disposed on external surfaces of the main body may be electrically connected to the first and second internal electrodes through portions of the first and second internal electrodes alternately exposed through both end surfaces of the main body. Therefore, when a voltage is applied to the first and second external electrodes 22a and 22b, electric charges may be accumulated between the first and second internal electrodes facing each other. In this case, capacitance of the multilayer electronic component is in proportion to an area of overlapping regions between the first and second internal electrodes.

The first and second external electrodes 22a and 22b may be composed of main portions formed by a conductive paste and containing a conductive metal and covering both end surfaces of the main body in the L-direction and extension portions extended from the main portions and covering portions of upper and lower surfaces and side surfaces of the main body. In this case, the conductive metal may be nickel (Ni), copper (Cu), or alloys thereof, but is not limited thereto.

First and second plating layers may be further formed on the first and second external electrodes 22a and 22b to cover the external electrodes. The first and second plating layers as described above may further increase an effect of preventing cracks from being generated in the body due to contraction or tensile strength generated during a plating process on the external electrodes. Preferably, a thickness of the first and second plating layers may be adjusted to be 5 μm or less in order to prevent a reliability defect due to the infiltration of moisture into the main body, but the thickness of the first and second plating layers is not limited thereto.

The multilayer electronic component according to the present disclosure may include the composite body 23 disposed below the main body and the external electrodes while including the main body 21 and the external electrodes 22. An upper surface $S_B$ of the composite body may be disposed to contact a surface region of a lower portion of the lower cover region of the main body and surface regions of lower portions of the external electrodes.

The composite body 23 may contain a resin and a dielectric material.

The dielectric material may include a powder such as a barium titanate ($BaTiO_3$) powder, or the like, and it is possible that the dielectric material is a spherical powder, but the dielectric material is not limited thereto.

The dielectric material in the composite body may be the same as the dielectric material in the dielectric layer of the main body disposed on the composite body.

The resin may be contained in the composite body at a content of 6 wt % or more, based on 100 wt % of the dielectric material in the composite body. In other words, the content of the resin contained in the composite body may be 0.06 times or more that of the dielectric material contained in the composite body.

In this case, an upper limit of the content of the resin in the composite body is not particularly limited, which means that as much of the resin as possible may be injected in a manufacturing process so that the content of the dielectric material in the composite body may be ignored.

Further, the content of the resin in the composite body may be between 6 wt % to 200 wt %, based on 100 wt % of the dielectric material in the composite body. In other words, the content of the resin contained in the composite body may be 0.06 to 2 times that of the dielectric material contained in the composite body.

When the content of the resin in the composite body is within the range of 6 wt % to 200 wt %, based on 100 wt % of the dielectric material in the composite body, when the composite body is formed using a composite material in which the dielectric material and the resin are mixed with each other in a situation in which densities of the dielectric material and the resin contained in the composite body are different from each other, the composite material may be closely packed without air gaps in the composite body.

On the contrary, when the content of the resin is less than 6 wt %, based on 100 wt % of the dielectric material in the composite body, it may be difficult to perform a dispersing and molding process for forming the composite body. Furthermore, when the content of the resin is greater than 200 wt %, based on 100 wt % of the dielectric material in the composite body, the content of the dielectric material may be relatively small, such that mechanical strength may not be secured.

The resin in the composite body may be a thermosetting resin. For example, the resin may include one or more selected from the group consisting of an epoxy resin, a phenoxy resin, a polyimide resin, a polyamideimide (PAI) resin, a polyether imide (PEI) resin, a polysulfone (PS) resin, a polyethersulfone (PES) resin, a polyphenylene ether (PPE) resin, a polycarbonate (PC) resin, a polyetherether ketone (PEEK) resin, and a polyester resin.

Since the employed resin exists on a surface of a completed multilayer electronic component as it is, it is preferable to use a high heat-resistant resin capable of enduring a mounting temperature (at least 300° C.) of the electronic component. Further, in addition to high heat-resistance, since room-temperature flowability may aid in securing a filling rate of the composite body and processability, it is possible to use a novolac based epoxy resin improving flowability at room temperature and a rubber based epoxy resin having a high molecular weight (a molecular weight of 15,000 or more) of which flowability is secured.

The composite body may contain a toughening agent of 1 to 30 PHR in order to secure mechanical strength after the final curing.

The following Table 1 illustrates an effect of decreasing acoustic noise depending on a content of a dielectric material (barium titanate powder) to a resin (epoxy resin) in the composite body.

TABLE 1

| Sample | Method | Classification | Acoustic noise (dB) |
|---|---|---|---|
| Comparative Example 1 | General MLCC According to Related Art | Vertical | 38.6 |
| Comparative Example 2 | | Horizontal (Ref.) | 35.2 |
| Comparative Example 3 | Thick Bottom Cover MLCC | Addition of Lower Cover Region | 27.9 |
| Experimental Example 1 | Composite Body (Based on 100 wt % of Dielectric Material) | Resin content: 100 wt % | 24.5 |
| Experimental Example 2 | | Resin content: 200 wt % | 25.7 |

In Table 1, multilayer ceramic capacitors (MLCC) used in Comparative Examples 1 to 3 and Experimental Examples 1 and 2 had a 1608 size (about 1.64 mm×0.88 mm (length× width (L×W))). In this case, a manufacturing tolerance was determined in a range of ±0.1 mm (length×width (L×W)), and experiments were performed on samples satisfying this range, such that acoustic noise was measured in each sample. In order to measure the acoustic noise, after one sample (multilayer electronic component) per a board for measuring acoustic noise was mounted on a circuit board in a direction in which upper and lower portions of the sample were distinguished, the circuit board was mounted on a jig for measurement. In addition, a DC voltage and voltage variation were applied to both terminals of the sample mounted on the jig for measurement using a DC power supply and a function generator. The acoustic noise was measured through a microphone installed directly above the circuit board.

In Table 1, Comparative Example 1 corresponds to an acoustic noise level in a case in which internal electrodes of a MLCC (1608 size, 22 μF) were arranged perpendicular to a mounting surface, and Comparative Example 2 corresponds to an acoustic noise level in a case in which internal electrodes of a MLCC (1608 size, 22 μF) were arranged horizontally to a mounting surface.

As known from the results of Comparative Examples 1 and 2, in a case in which an arrangement direction of the internal electrodes was perpendicular to the mounting surface, acoustic noise level was 35.2 dB, but when in a case in which the arrangement direction of the internal electrodes was vertical to the mounting surface, acoustic noise level was 38.6 dB. In the case in which the arrangement direction of the internal electrodes was vertical to the mounting surface, the acoustic noise level was increased by about 3.4 dB as compared to the case in which the arrangement direction thereof was perpendicular to the mounting surface. In other words, it is preferable that the internal electrodes are arranged in a direction perpendicular to the mounting surface in order to decrease acoustic noise.

Further, in Table 1, the MLCC in Comparative Example 3, an MLCC chip of which a thickness of a lower cover region was thicker than that of an upper cover region in order to decrease acoustic noise, is an MLCC in which a hard body having a thickness of 250 μm and formed by sintering a dielectric material is added to a lower cover region of the MLCC in Comparative Examples 1 and 2.

In Comparative Example 3, since a thickness of the lower cover region in the MLCC was thicker than that of the upper cover region, transferal of vibration sounds generated from a circuit board on which the MLCC was mounted may be prevented. In this case, an acoustic noise level in Comparative Example 3 was about 27.9 dB.

The acoustic noise level in Comparative Example 3 was decreased by about 27% as compared to the acoustic noise level (38.6 dB) in Comparative Example 1, and was also decreased by about 20% as compared to the acoustic noise level (35.2 dB) in Comparative Example 2. In other words, in order to further decrease acoustic noise, it is useful to expand the lower cover region included in the main body so that the thickness of the lower cover region in the MLCC is thicker than that of the upper cover region.

However, in the MLCC in Comparative Example 3, the lower cover region in the main body was extended and expanded. The MLCC in Comparative Example 3 is distinguished from a multilayer electronic component to which a separate composite body is added separately from the main body according to the exemplary embodiment in the present disclosure. In detail, the lower cover region in Comparative Example 3, which was a region formed by sintering dielectric material, was the rigid hard body, but since the composite body contacting the lower surface of the lower cover region of the main body according to the exemplary embodiment in the present disclosure was formed of the composite material of the dielectric material and the resin, the composite body may be distinguished from the hard body.

Meanwhile, Experimental Examples 1 and 2 of Table 1 correspond to exemplary embodiments in the present disclosure.

In Experimental Examples 1 and 2, acoustic noise of the multilayer electronic components in which the composite body having a thickness of 250 μm was added to a lower surface of a lower cover region of an MLCC (1608 size, 22 μF) was measured.

First, Experimental Example 1 corresponds to a case in which a content of the resin in the composite body was 100 wt % based on 100 wt % of the dielectric material in the composite body. As illustrated in [Table 1], an acoustic noise level in Experimental Example 1 was 24.5 dB. The acoustic noise level in Experimental Example 1 was decreased by about 12% as compared to the MLCC (Comparative Example 3) including the lower cover region formed of the rigid hard body having the same thickness (250 μm). Therefore, it may be appreciated that in the MLCC in which the composite body containing the dielectric material and the resin was added, acoustic noise was effectively decreased as compared to the MLCC in which the lower cover region was extended using the rigid hard body.

Next, Experimental Example 2 corresponds to a case in which a content of the resin in the composite body was 200 wt % based on 100 wt % of the dielectric material in the composite body. As illustrated in [Table 1], an acoustic noise level in Experimental Example 2 was 25.7 dB. The acoustic noise level in Experimental Example 2 was slightly increased as compared to that in Experimental Example 1, but was decreased as compared to acoustic noise levels of the MLCCs in Comparative Examples 1 to 3 in which the composite body was not applied.

Figure 4:
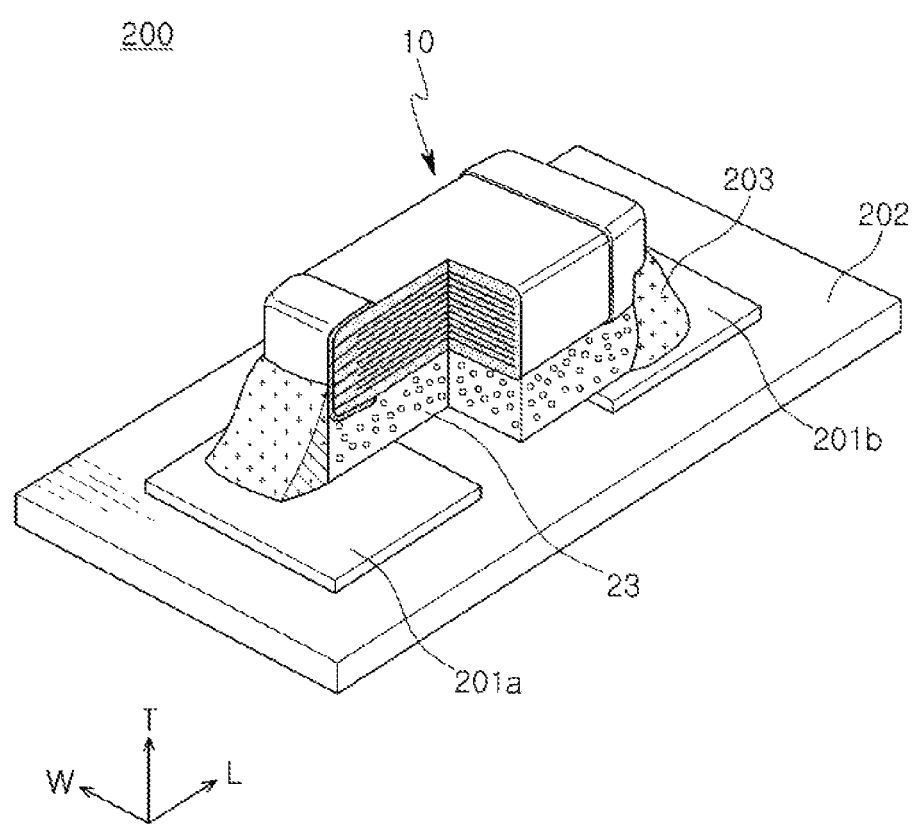
FIG. 4 is a schematic perspective view illustrating a board in which the multilayer electronic component of FIG. 1 is mounted on a circuit board.

Meanwhile, referring to FIG. 4, a form in which the multilayer electronic component according to the exemplary embodiment in the present disclosure is mounted on a circuit board.

A board 200 having a multilayer electronic component may include the multilayer electronic component 10, electrode pads 201a and 201b, and a circuit board 202. The multilayer electronic component may be mounted on the circuit board so that a composite body 23 of the multilayer electronic component 10 is disposed at a lower portion thereof in a T-direction. When the multilayer electronic component 10 is mounted on the circuit board 202 and a voltage is applied thereto, acoustic noise may be generated. In this case, sizes of the electrode pads 201a and 201b may determine an amount of solder 203 connecting external electrodes of the multilayer electronic component and the electrode pads, and in a case in which the amount of solder 203 is decreased, acoustic noise may be decreased. Here, in the case of using the multilayer electronic component according to the present disclosure, since the composite body is interposed in surface regions of lower portions of the external electrodes, there is no need to increase the sizes of the electrode pads on which the multilayer electronic component is mounted, and as a result, acoustic noise may be decreased.

Since the multilayer electronic component according to the present disclosure includes the composite body disposed to come in contact with the lower cover region of the main body and the surface regions of the lower portions of the external electrodes, at the time of applying the voltage after mounting the multilayer electronic component on the circuit board, acoustic noise may be significantly decreased.

In detail, a mechanism of decreasing acoustic noise is as follows.

According to the exemplary embodiment in the present disclosure, the lower cover region may not be formed to be thicker than the upper cover region and the multilayer electronic component may be disposed to be spaced apart from the electrode pads of the board substantially by a height of the composite body, and vibrations caused by a displacement difference between the multilayer electronic component exposed to electric fields and the board may be directly avoided, such that acoustic noise may be decreased.

According to the exemplary embodiment in the present disclosure, since the composite body is formed of the composite material of the dielectric material and the resin instead of the hard body formed of the dielectric material, the composite body may sufficiently absorb vibrations, or the like, by the displacement difference between the board and the multilayer electronic component, and significantly decrease the transferring of the vibration, thereby decreasing acoustic noise.

Method of Manufacturing Multilayer Electronic Component

Hereinafter, an example of a method of manufacturing a multilayer electronic component having the above-mentioned structure will be described.

The method of manufacturing a multilayer electronic component according to an exemplary embodiment in the present disclosure may include: preparing a main body; preparing a composite body; and integrating the prepared main body and the prepared composite body as a single multilayer electronic component.

External electrodes may be disposed on outer side surfaces of the main body, and the main body on which the external electrodes are formed may be referred to as a preliminary body.

In order to prepare the preliminary body, slurry containing a powder such as a barium titanate ($BaTiO_3$) powder, or the like, maybe applied and dried onto a carrier film, thereby preparing a plurality of ceramic green sheets having a predetermined thickness. Next, a plurality of first and second internal electrodes alternately exposed to both end surfaces of the ceramic green sheets may be formed in a T-direction by applying a conductive paste for an internal electrode on respective ceramic green sheets so as to be exposed to both end surfaces of the ceramic green sheets opposing each other in an L-direction of the ceramic green sheets. Here, the conductive paste may be applied by a screen-printing method, or the like, but the application method is not limited thereto.

Then, the plurality of ceramic green sheets on which the first and second internal electrodes are formed may be stacked in a T-direction, and ceramic green sheets on which the internal electrodes are not formed are stacked above and below a stacked structure of dielectric layers on which the internal electrodes are formed, respectively, thereby forming upper and lower cover regions. Further, the stacked structure including the plurality of internal electrodes and a dielectric material and the upper and lower cover regions may be compressed, when compression is completed, the compressed structure may be cut into an individual chip. Thereafter, the individual chip may be sintered, thereby forming a main body. In this case, due to sintering shrinkage of dielectric powder at the time of sintering, the main body does not have a hexahedral shape with complete straight lines but may have a substantially hexahedral shape. However, the main body is not limited thereto.

Next, first and second external electrodes may be formed on both end surfaces of the main body. The first and second external electrodes may include main portions covering both end surfaces of the main body to thereby be electrically connected to the first and second internal electrodes and extension portions covering portions of upper and lower surfaces and side surfaces of the main body. If necessary, first and second plating layers may be formed to cover the first and second external electrodes on both end surfaces of the main body by a plating method. In this case, the first and second plating layers may be formed so that a sum of a thickness of one portion thereof and a thickness of one portion of the extension portions of the first and second external electrodes is 5 µm or less, but the thickness of the first and second plating layers is not limited thereto.

As described above, after the preliminary body including the main body and the external electrodes are prepared, a plate-shaped composite body may be prepared through a process separate from that of the preliminary body. The plate-shaped composite body may be manufactured by preparing slurry in which a resin and a dielectric material are mixed with each other and casting the prepared slurry.

According to the exemplary embodiment in the present disclosure, the resin contained in the composite body may be an epoxy resin, and the dielectric material may be a barium titanate ($BaTiO_3$)-based powder. Based on 100 wt % of the dielectric material, a content of the resin may be preferably within the range of 6 wt % to 200 wt %.

Figure 5A:
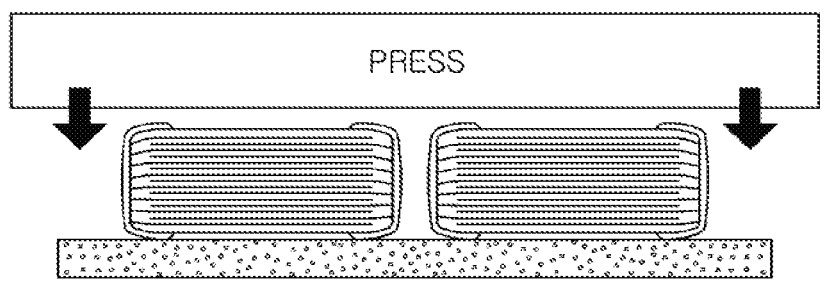
FIGS. 5A through 5C are schematic views schematically illustrating a method of manufacturing the multilayer electronic component shown in FIG. 1.

After preparing the composite body and the preliminary body as described above, as illustrated in FIG. 5A, a press process may be performed so that a lower cover region of the preliminary body and a surface region of a lower portion of the external electrodes are uniformly adhered onto the plate-shaped composite body (see FIG. 5A).

Figure 5B:
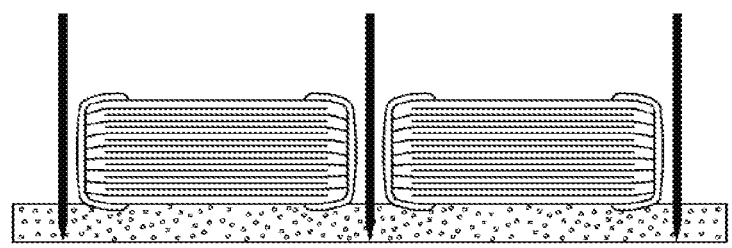

A composite component in which the composite body and the preliminary body are adhered to each other by the press process may be cut into individual electronic components according to the size of the electronic component (see FIG. 5B).

Figure 5C:
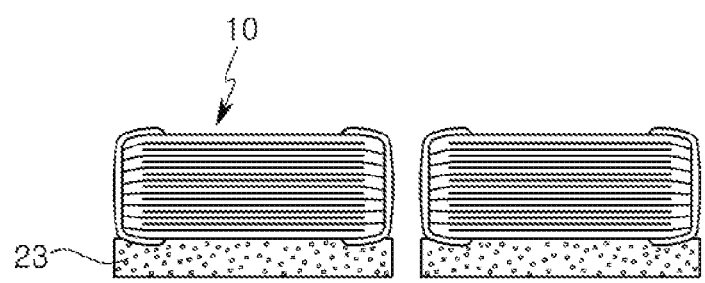

Thereafter, the individual composite components are cured and dried (see FIG. 5C), thereby completely adhering the preliminary body and the composite body to each other.

When using the method according to the present disclosure, a multilayer electronic component including a main body 21 including an active region in which a plurality of internal electrodes are stacked with respective dielectric layers interposed therebetween and upper and lower cover regions above and below the active region, respectively; external electrodes 22 disposed on external surfaces of the main body and electrically connected to the internal electrodes; and a composite body 23 disposed on the lower cover region of the main body and lower portions of external electrodes may be provided.

Except for the description described above, a description of features overlapping those of the multilayer electronic component according to the exemplary embodiment in the present disclosure described above will be omitted.

As set forth above, according to exemplary embodiments in the present disclosure, a multilayer electronic component where acoustic noise is significantly decreased when mounted on a circuit board, and the board having the same maybe provided.

According to exemplary embodiments in the present disclosure, a multilayer electronic component where solder cracks are significantly less likely to be generated between the external electrodes of the multilayer electronic component and the solder at the time of being mounted on the circuit board, and a board having the same may be provided.

While exemplary embodiments have been shown and described above, it will be apparent to those skilled in the art that modifications and variations could be made without departing from the scope of the present invention as defined by the appended claims.

What is claimed is:

1. A multilayer electronic component comprising:
a main body including an active region in which a plurality of internal electrodes are stacked with respective dielectric layers interposed therebetween, and upper and lower cover regions disposed above and below the active region, respectively;
external electrodes disposed on external surfaces of the main body and electrically connected to the plurality of internal electrodes; and
a composite body disposed below the lower cover region of the main body and lower portions of the external electrodes,
wherein the composite body comprises a dielectric material having a same composition as that of a dielectric material contained in the lower cover region of the main body,
wherein the composite body further comprises a resin, and
wherein a content of the resin is at least 6 wt % based on 100 wt % of the dielectric material.

2. The multilayer electronic component of claim 1, wherein the dielectric material includes one or more of a barium titanate ($BaTiO_3$)-based powder and a strontium titanate ($SrTiO_3$)-based powder.

3. The multilayer electronic component of claim 1, wherein the content of the resin is at most 200 wt % based on 100 wt % of the dielectric material.

4. The multilayer electronic component of claim 1, wherein the resin is a heat-resistant resin.

5. The multilayer electronic component of claim 1, wherein the resin includes one or more selected from the group consisting of an epoxy resin, a phenoxy resin, a polyimide resin, a polyamideimide resin, a polyether imide resin, a polysulfone resin, a polyethersulfone resin, a polyphenylene ether resin, and polycarbonate resin, a polyetherether ketone resin, and a polyester resin.

6. The multilayer electronic component of claim 1, wherein the upper cover region of the main body has a thickness equal to or greater than that of the lower cover region of the main body.

7. The multilayer electronic component of claim 1, wherein the composite body is arranged such that at least a portion of at least one of the upper cover region, the lower cover region, or at least one of the external electrodes, is exposed.

8. The multilayer electronic component of claim 1, wherein an entirety of a lower surface of the external electrodes substantially contacts the composite body.

9. A multilayer electronic component comprising:
a main body including an active region in which a plurality of internal electrodes are stacked with respective dielectric layers interposed therebetween, and upper and lower cover regions disposed above and below the active region, respectively;
external electrodes disposed on external surfaces of the main body and electrically connected to the plurality of internal electrodes; and
a composite body disposed below the lower cover region of the main body and lower portions of the external electrodes,
wherein the composite body comprises a dielectric material which includes one or more of a barium titanate ($BaTiO_3$)-based powder or a strontium titanate ($SrTiO_3$)-based powder,
wherein the composite body further comprises a resin, and
wherein a content of the resin is at least 6 wt % based on 100 wt % of the dielectric material.

10. The multilayer electronic component of claim 9, wherein the dielectric material contained in the composite body has the same composition as that of a dielectric material contained in the lower cover region of the main body.

11. The multilayer electronic component of claim 9, wherein a thickness of the composite body is greater than a thickness of at least one of the external electrodes.

12. The multilayer electronic component of claim 9, wherein the content of the resin is at most 200 wt % based on 100 wt % of the dielectric material.

13. The multilayer electronic component of claim 9, wherein the resin is a heat-resistant resin.

14. The multilayer electronic component of claim 9, wherein the resin includes one or more selected from the group consisting of an epoxy resin, a phenoxy resin, a polyimide resin, a polyamideimide resin, a polyether imide resin, a polysulfone resin, a polyethersulfone resin, a polyphenylene ether resin, a polycarbonate resin, a polyetherether ketone resin, and a polyester resin.

15. The multilayer electronic component of claim 9, wherein the upper cover region of the main body has a thickness equal to or greater than that of the lower cover region of the main body.

16. The multilayer electronic component of claim 9, wherein an entirety of a lower surface of the external electrodes substantially contacts the composite body.

* * * * *